United States Patent
Rupp et al.

(10) Patent No.: US 6,299,683 B1
(45) Date of Patent: Oct. 9, 2001

(54) METHOD AND APPARATUS FOR THE PRODUCTION OF SIC BY MEANS OF CVD WITH IMPROVED GAS UTILIZATION

(75) Inventors: Roland Rupp, Lauf; Johannes Voelkl, Erlangen, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 08/791,519

(22) Filed: Jan. 30, 1997

(30) Foreign Application Priority Data

Jan. 30, 1996 (DE) .............................. 196 03 323

(51) Int. Cl.[7] .................................. C23C 16/00
(52) U.S. Cl. .............................. 117/88; 117/98; 117/951; 118/715; 118/719; 118/725; 427/249.15
(58) Field of Search ...................... 118/715, 719, 118/725; 117/88, 98, 951; 427/249, 249.15

(56) References Cited

U.S. PATENT DOCUMENTS

| 4,340,568 | 7/1982 | Hirai et al. . |
| 5,093,150 | 3/1992 | Someno, et al. ........................ 427/38 |
| 5,704,985 | * 1/1998 | Kordina ................................ 118/725 |

FOREIGN PATENT DOCUMENTS

| 41 42 877 | 7/1992 | (DE) . |
| 0 582 444 | 2/1994 | (EP) . |
| 54-106100 | * 8/1979 | (JP) . |
| 62-37374 | * 2/1987 | (JP) . |
| 62-70297 | * 3/1987 | (JP) . |
| 62-91496 | * 4/1987 | (JP) . |
| 2-46723 | * 2/1990 | (JP) . |
| 6-112147 | * 4/1994 | (JP) . |
| 6-128094 | * 5/1994 | (JP) ........................................ 117/951 |
| 7-201756 | * 8/1995 | (JP) . |

OTHER PUBLICATIONS

Patent Abstracts of Japan, vol. 013, No. 011 (–558), Jan. 11, 1989. (JP 63/216973A).

Nishino et al., Chemical Vapor Deposition of Single Crystalline B–SiC Films on Silicon Substrate with Sputtered SiC Intermediate Layer, J. Electrochem. Soc. 127 (1980), No. 12, pp. 2674–2680.

Kordina et al., High Temperature Chemical Vapor Deposition, Technical Digest of Int'l Conf. on SiC and Related Materials, 1995, p. 609.

* cited by examiner

Primary Examiner—Richard Bueker
(74) Attorney, Agent, or Firm—Herbert L. Lerner; Laurence A. Greenberg; Werner H. Stemer

(57) ABSTRACT

A process gas stream (2) is generated, from which SiC is deposited on a substrate (4) by means of CVD. Furthermore, a second gas stream (3) of an inert gas is generated, which substantially surrounds the process gas stream (2) in its direction of flow. This results in a higher yield of the process gases.

7 Claims, 5 Drawing Sheets

METHOD AND APPARATUS FOR THE PRODUCTION OF SIC BY MEANS OF CVD WITH IMPROVED GAS UTILIZATION

BACKGROUND OF THE INVENTION

1. Field of the Invention

The invention relates to a method for the production of silicon carbide by means of chemical deposition from the gas phase, i.e. chemical vapor deposition (CVD).

2. Description of Related Art

In a CVD process for the production of silicon carbide (SiC), a gas stream consisting of working gases to provide silicon and carbon, and a carrier gas (generally hydrogen) is passed to a substrate, and SiC is deposited on the substrate from the gas mixture, by means of chemical reactions. From "Technical Digest of International Conference on SiC and Related Materials, Kyoto, Japan, 1995, page 609" a CVD method for the production of monocrystalline SiC is known, in which the substrate temperatures are adjusted to be between 1800° C. and 2300° C. This results in high growth rates, without any negative influence on the crystal quality. The growth rates for this known method amount to as much as 0.5 mm/h. However, with the known method, only crystals with a maximum length of 2 mm can be grown.

SUMMARY OF THE INVENTION

It is an object of the invention to provide a method and an apparatus for the production of silicon carbide by means of CVD, in which greater utilization of the process gases is achieved than is achieved with the prior art.

The invention is directed to a method for the production of silicon carbide which includes directing a first gas stream at a substrate. The first gas stream includes at least one working gas to provide silicon (Si) and carbon (C) and at least one carrier gas. From this first gas stream, silicon carbide grows on the substrate by means of chemical gas phase deposition, i.e. chemical vapor deposition (CVD). Additionally, a second gas stream is generated which practically surrounds the first gas stream completely, parallel to its direction of flow.

The invention is also directed to an apparatus for the production of silicon carbide (SiC) which includes a reactor, at least one substrate arranged in the reactor, means to generate a first gas stream directed at the substrate, with at least one working gas to provide silicon (Si) and carbon (C) and with at least one carrier gas, where silicon carbide grows on the substrate by means of chemical vapor deposition (CVD), and means to generate a second gas stream which substantially surrounds the first gas stream, parallel to its direction of flow.

The invention is based on the recognition that the divergence of the first gas stream can be reduced by the second gas stream, which surrounds the first gas stream, and that a high level of stability of the concentration of the process gases in the first gas stream is achieved in this way. This results in greater utilization of the working gases introduced into the process. With the same growth temperatures on the substrate, and with the same total gas flows of the process gases, the growth rate of the silicon carbide growing on the substrate therefore increases. With the second gas stream according to the invention, it was possible to achieve a working gas yield more than ten times higher than without the second gas stream.

Preferred embodiments and further developments of the method and apparatus will become apparent from the detailed description of the invention which follows. In a first embodiment, the flow velocity of the first gas stream is adjusted to be greater than the flow velocity of the second gas stream, by means of a corresponding form of the means to generate the two gas streams. Because of the higher flow velocity of the first gas stream, the loss of process gases from the first gas stream into the second gas stream due to interdiffusion of gas particles of the process gases and the carrier gas, is kept low.

The means to generate the first gas stream which is directed at the substrate preferably contains at least a nozzle with an outlet facing the substrate, and means for supplying at least one working gas and at least one carrier gas to the nozzle. The means to generate the second gas stream can then have a diffusor which generates an essentially homogeneous second gas stream and surrounds the nozzle of the means to generate the first gas stream.

In a further embodiment, a gas or gas mixture with a lesser viscosity than the first gas stream is provided for the second gas stream. This prevents mixture of the two gas streams due to eddy formation.

Preferred gases for the second gas stream are gases which do not chemically attack graphite, such as inert gases or inert gas mixtures. This makes it possible to use graphite parts in the reactor, even at high temperatures. If there are no graphite parts, particularly if there are no graphite parts in the reactor, hydrogen is also suitable for the second gas stream.

The growth temperature on the substrate is preferably adjusted to be between approximately 800° C. and approximately 2500° C.

In a particularly advantageous embodiment, monocrystalline silicon carbide is produced, which is particularly useful for semiconductor components.

BRIEF DESCRIPTION OF THE DRAWINGS

Various other objects, features and advantages of the present invention will be more fully appreciated from the following detailed description of the invention discussed in view of the accompanying drawings wherein.

DETAILED DESCRIPTION OF THE INVENTION

Figure 1:
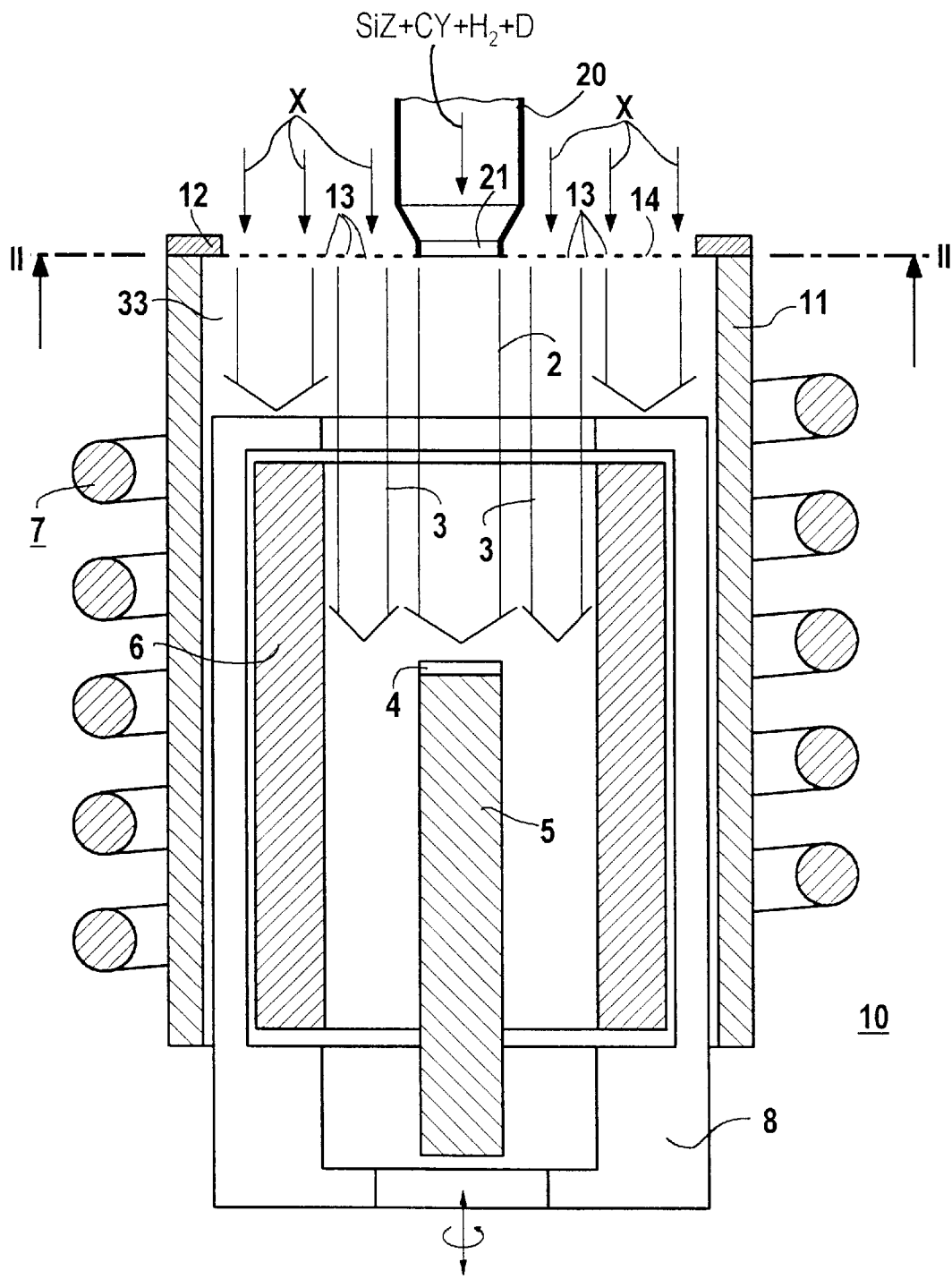
FIG. 1 shows a device for the production of silicon carbide in longitudinal cross-section.

The apparatus according to FIG. 1 comprises a reactor 10 with an outside wall 11, which can be formed in the shape of a hollow or tube-shaped cylinder, and is preferably cooled, for example by a water cooling system. The outside wall 11 of the reactor 10 can particularly consist of quartz glass. A lid 12 is set onto the outside wall 11 at one face, which can be, for example, flanged on. Suszeptor 6 is arranged in the interior 33 of the reactor 10, which is enclosed by the outside wall 11. The suszeptor 6 can be formed in the shape of a hollow cylinder and is heated by a high-frequency field generated by a high-frequency coil 7 (induction heating). A preferred material for the suszeptor 6 is graphite. The suszeptor 6 is preferably thermally insulated from the outside wall 11 by means of heat insulation 8, which can be formed, for example, of a graphite foam. Inside the suszeptor 6, a substrate holder 5, which carries a substrate 4, is arranged. The substrate holder 5 consists, for example, of graphite. Substrate 4 is a substrate suitable for a CVD process for SiC, such as a silicon substrate (at temperatures up to approximately 1400° C.), a tantalum carbide (TaC) substrate, or a SiC substrate.

A nozzle 20 is passed through the lid 12 of the reactor 10, in a central region, with an outlet 21 which opens into the interior 33 of the reactor 10 and faces the substrate 4. The dimensions of the outlet 21 of the nozzle 20 are preferably adapted to the dimensions of the substrate 4, in at least one direction. The distance between the outlet 21 of the nozzle 20 and the substrate 4 is generally between approximately 2 cm and approximately 50 cm. The nozzle 20 has process gases supplied to it, which are suitable for a CVD process for the production of silicon carbide (SiC), and particularly for the production of monocrystalline silicon carbide. These process gases comprise at least one working gas designated as SiZ (precursor, source), to provide silicon (Si), at least one working gas designated as CY, to provide carbon (C), at least one carrier gas, generally hydrogen ($H_2$), and, if necessary, a doping gas D for the desired doping of the SiC. The gas mixture of these process gases flows through the outlet 21 of the nozzle 20 as a first gas stream 2, onto the substrate 4, in the heated interior of the suszeptor 6. In this connection, the flow velocity of the process gases is greater when it exits from the nozzle 20 than when it enters into the nozzle 20. When the first gas stream 2 hits the heated substrate 4, silicon carbide is deposited by means of chemical reactions resulting from the working gases, with the participation of the hydrogen carrier gas (CVD=chemical vapor deposition=chemical gas phase deposition) The structure of the silicon carbide which is deposited is particularly dependent on the material of the substrate 4 and the growth temperatures which prevail on the growth surface. At higher growth temperatures, particularly above approximately 800° C., the growing SiC is monocrystalline. At growth temperatures below approximately 800° C., however, the SiC growth is polycrystalline or amorphous. The growth temperatures can be adjusted by means of the energy of the high-frequency field of the high-frequency coil 7. The first gas stream 2 can hit the substrate 4 at a freely selectable angle between 0° and 90°, preferably about 90°.

The substrate holder 5 can preferably be shifted up or down along a longitudinal axis. This allows the substrate 4 or the growth surface of the growing SiC to be brought to a desired location in the temperature field inside the suszeptor 6. In a particularly advantageous embodiment, the substrate holder 5 can be rotated about its longitudinal axis. By continuously rotating the substrate holder 5, and thereby the substrate 4, during the process, the homogeneity of the growing SiC can be clearly increased. Typical rates of rotation are between about 5 rotations per minute (rpm) and about 1000 rpm. This embodiment, with a rotating substrate holder 5, is particularly advantageous in combination with a slit-shaped outlet 21 of the nozzle 20, since the asymmetry of the first gas stream 2 is balanced out by the rotation of the substrate 4.

In addition to the first gas stream 2, a second gas stream 3 is generated, which surrounds the first gas stream 2 on the sides. The two gas streams 2 and 3 therefore flow essentially parallel to one another. The divergence of the first gas stream 2 between the outlet 21 and the substrate 4 is clearly reduced by the second gas stream 3. This makes it possible to achieve a yield of the process gases used, particularly the working gases SiZ and CY, which is greater by a factor of up to 10. Preferably, the total pressure in the reactor 10 is also controlled via the second gas stream 3. In the embodiment shown in FIG. 1, the second gas stream 3 offers the additional advantage that the hydrogen in the first gas stream 2 is essentially kept away from the graphite parts in the reactor 10, particularly the suszeptor 6. This prevents chemical decomposition of the suszeptor 6, and the ratio of working gases adjusted in the first gas stream 2 can be better maintained. The second gas stream 3 preferably consists of a gas or a gas mixture which does not chemically intervene in the growth process on the substrate 4. A gas or gas mixture with a lower viscosity than the gas mixture of the first gas stream 2 is particularly advantageous for the second gas stream 3. An inert gas such as helium (He) or argon (Ar) or a mixture of inert gases is particularly advantageous for the second gas stream 3.

To generate the second gas stream 3, several inlets 13 are provided in the lid 12 of the reactor 10, through which a gas or gas mixture, designated as X, can flow into the interior 33 of the reactor 10, delimited by the outside wall 11. These inlets 13 are arranged around the outlet 21 of the nozzle 20, preferably in a concentric arrangement. The inlets 13 in the lid 12 are preferably formed in such a way that an essentially homogeneous second gas stream 3 is formed from the gas X which is supplied. It is particularly advantageous to use a diffusor 14, which is preferably formed with a metal mesh with a mesh width of between approximately 100 $\mu$m and approximately 500 $\mu$m, to generate a homogeneous gas stream. Such diffusers 14 are commercially available. At its edges, the diffusor is clamped in place with corresponding means of attachment, and forms a part of the lid 12. In the embodiment shown in FIG. 1, the inlets 13, i.e. the meshes of the diffusor 14, are arranged essentially at the same level, i.e. essentially in the same plane, with the outlet 21 of the nozzle 20. However, the outlet 21 of the nozzle 20 can also be arranged offset into the interior, in the flow direction of the first gas stream 2.

Figure 2:
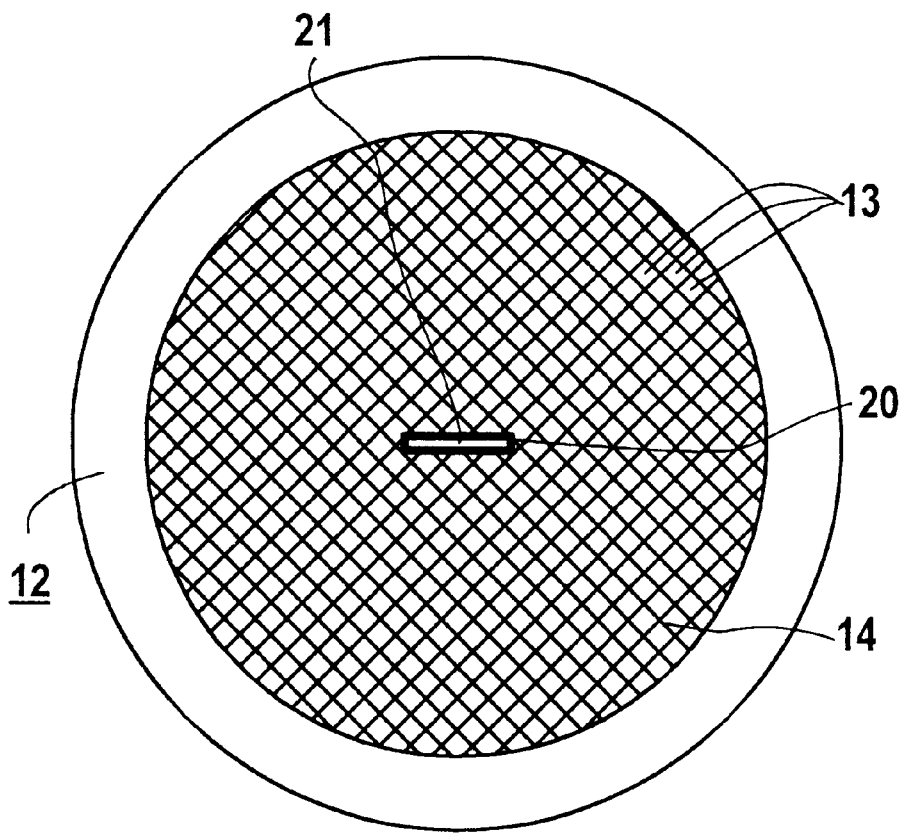
FIG. 2 shows a cross-section through the device of FIG. 1.

FIG. 2 shows a cross-section through the lid 12 and the nozzle 20 of the device according to FIG. 1, indicated at II in FIG. 1. The diffusor 14 with the inlets 13 is clamped in place as a metal mesh between the nozzle 20 and an edge (not specifically indicated) of the lid 12. The mesh of the diffusor 14 should fit closely around the outlet 21 of the nozzle 20. The outlet 21 of the nozzle 20 is formed as a slit in the embodiment shown in FIG. 2, where the lengthwise dimension of the slit is adapted to the diameter of the substrate.

Figure 3:
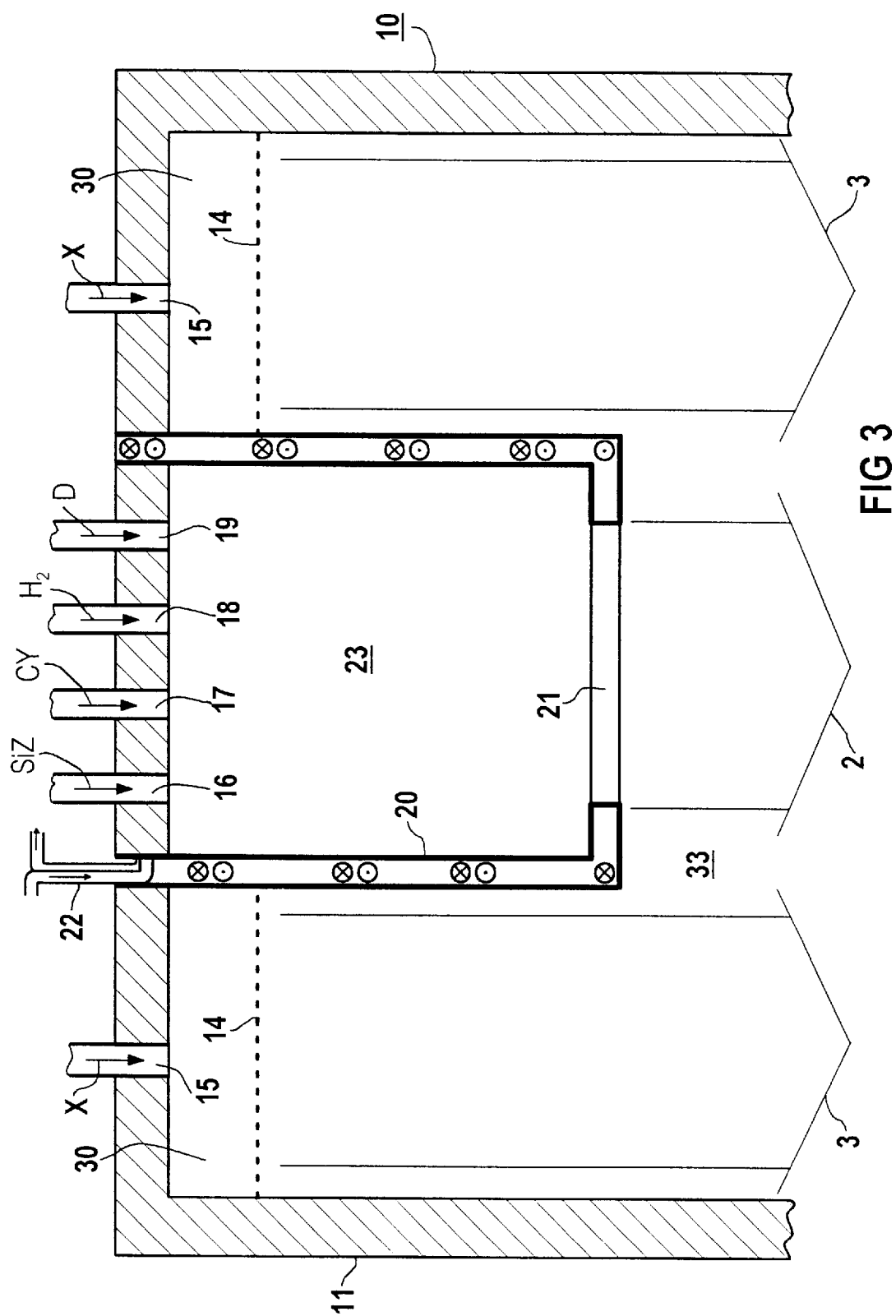
FIG. 3 shows means to generate two gas streams as part of a device for the production of silicon carbide.

FIG. 3 shows an enlarged view of the gas inlet region in the top part of the reactor 10, in crosswise cross-section. The nozzle 20 projects into the interior 33 of the reactor 10, surrounded by the outside wall 11. The nozzle 20 is again closely surrounded by the diffusor 14. As bounded between the outside wall 11, the diffusor 14, and the nozzle 20, a gas ante-room 30 is formed, separated from the remaining interior 33 of the reactor 10. The gas X for the second gas stream 3 is introduced into this gas ante-room 30 via one or more inlets 15, and passed through the diffusor 14 into the interior 33 of the reactor, as a second gas stream 3. The working gas SiZ is introduced into the nozzle interior 23 of the nozzle 20 via an inlet 16, the working gas CY via another inlet 17, the carrier gas hydrogen via a third inlet 18, and a doping gas D via a fourth inlet 19. The gas mixture of these process gases flows through the outlet 21 of the nozzle 20 into the interior 33 of the reactor 10, as the first gas stream 2. In this embodiment, the outlet 21 of the nozzle 20 is offset into the interior 33 of the reactor 10, relative to the diffusor 14, and therefore is arranged closer to the substrate 4 (not shown in FIG. 3) than the diffusor 14. The second gas stream 3 flows between the outside wall 11 and the nozzle 20 to the level of the outlet 21, and then essentially parallel to the gas stream 2. Since the nozzle 20 is arranged closer to the heated region of the reactor 10 in this embodiment, a cooling system 22 is preferably provided for the nozzle 20, for example a liquid cooling system with an incoming line and an outgoing line parallel to the incoming line. Such liquid cooling systems 22, particularly water cooling systems, are known to a person skilled in the art. An advantage of the nozzle 20 projecting into the interior 33 is the small amount of mixing of the gas streams 2 and 3 due to the short common path.

Figure 4:
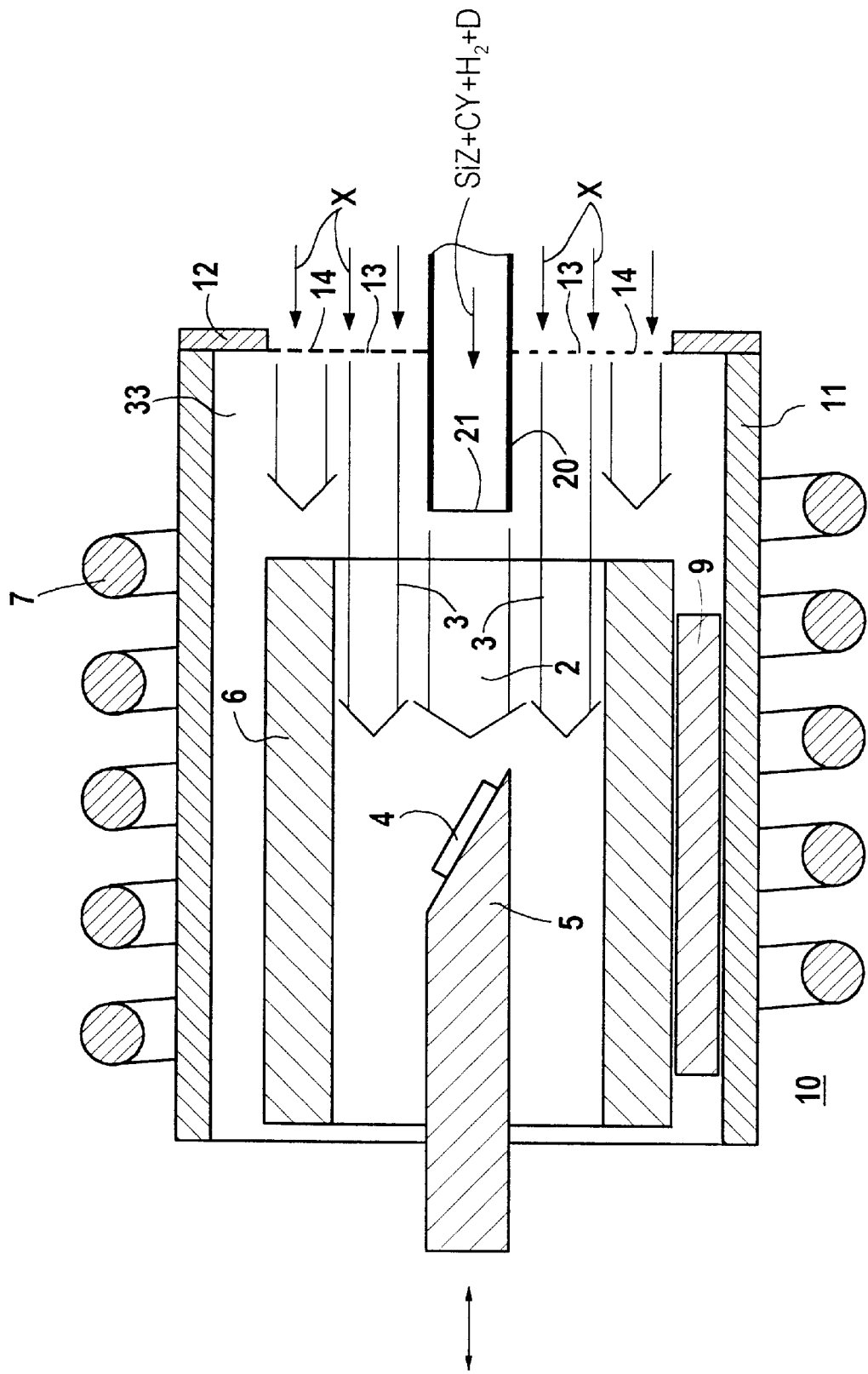
FIGS. 4 and 5 illustrate two additional exemplary embodiments of a device for the production of silicon carbide, each in longitudinal cross-section.

In the further exemplary embodiment of FIG. 4, an apparatus is shown with a reactor 10 rotated by 90° as compared with the exemplary embodiment of FIG. 1 (horizontal reactor). In this embodiment according to FIG. 4, the first gas stream 2 and the second gas stream 3 are essentially directed horizontally. The substrate 4 is arranged on a slanted surface of the substrate holder 5. The first gas stream 2 therefore hits the substrate 4 at an angle, and then flows over the substrate, in contrast to the exemplary embodiment according to FIG. 1, in which the first gas stream 2 hits the substrate 4 essentially perpendicularly. However, the substrate 4 can also be arranged perpendicular to the first gas stream 2, as in FIG. 1. The suszeptor 6 is arranged on a base layer 9. Another difference as compared to the embodiment according to FIG. 1 is that the nozzle 20 projects into the interior 33 of the reactor 10, similar to the embodiment according to FIG. 3. This results in a short distance between the substrate 4 and the outlet 21 of the nozzle 20. In this embodiment, the nozzle 20 is preferably cooled again. Also, the substrate holder can again be shifted along its longitudinal axis.

Figure 5:
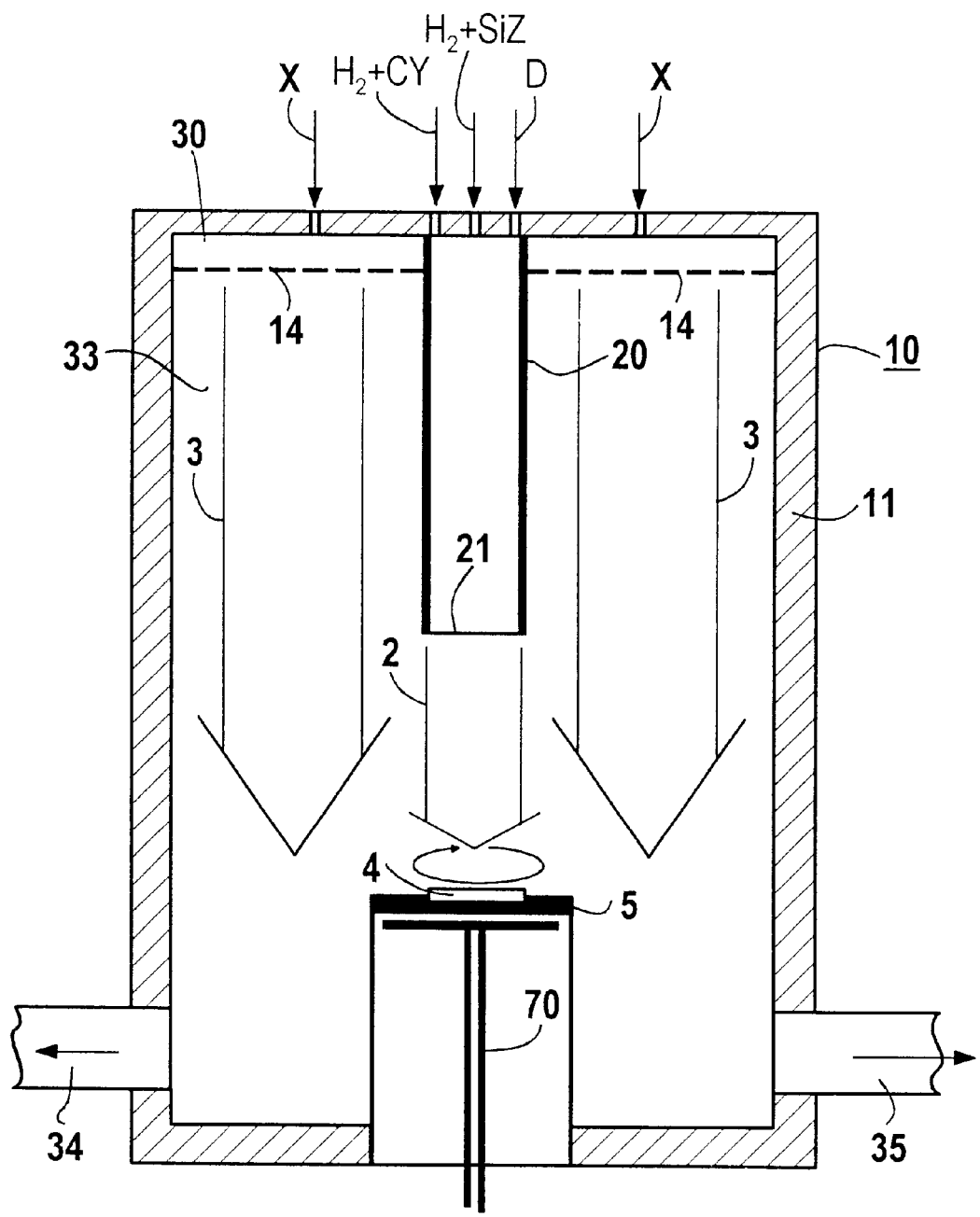

FIG. 5 shows another embodiment of the apparatus for the production of silicon carbide. In this embodiment, the substrate holder 5 is heated directly. For this purpose, a high-frequency coil 70 is arranged under the substrate holder 5, preferably a flat coil (pancake coil). This embodiment of the means of heating the substrate 4 has the advantage that no graphite parts are arranged in the interior 33 of the reactor 10, in the transport region for the first gas stream 2 and the second gas stream 3. Therefore even hydrogen can be used as the gas X for the second gas stream 3. The outside wall 11 of the reactor 10 may be made of stainless steel. The outside wall 11 is preferably cooled. A nozzle 20 which projects into the interior 33 of the reactor 10 is provided, and again, it is preferably cooled. Outlets 34 and 35 are provided, through which the excess gases are pumped out of the interior 33 of the reactor 10, by means of pumps (not shown). Such outlets are also provided in the other embodiments of the apparatus. The substrate holder 5 with the substrate 4 can preferably be rotated about a longitudinal axis.

The substrate holder 5 can be heated directly by passing an electric current through it as in resistance heating. To generate the first gas stream 2, rather than a nozzle, a simple inlet may be provided, through which the process gases, the carrier gases, and if applicable, doping gases, are allowed to enter the reactor.

The flow velocity of the first gas stream 2, which is directed at the substrate 4, is generally adjusted to be as great as possible in all the embodiments, and generally lies between 10 m/min and 300 m/min, preferably between 20 m/min and 60 m/min. This can be achieved by means of a corresponding selection of the nozzle 20.

The flow velocity of the second gas stream 3 is preferably kept low, in order to limit the consumption of gases. In an advantageous embodiment, the flow velocity of the first gas stream 2 is adjusted to be greater than the flow velocity of the second gas stream 3, in general between about 3 times and about 30 times that value.

Any known working gases for providing silicon and/or carbon and carrier gases as well as doping gases, if applicable, can fundamentally be used as process gases in the first gas stream 2, in all the embodiments. For example, silane can be used as the working gas SiZ for providing silicon, propane as the working gas CY for providing carbon, and hydrogen ($H_2$) can be used as the carrier gas. The concentration of silane is preferably between approximately 0.1% and approximately 3% in the first gas stream 2. The concentration of propane is generally adjusted to be lower by a factor of about 3 than the concentration of the silane. Basically, any known gas concentrations and gas ratios can be adjusted.

The flow cross-section of the first gas stream 2 is based on the dimensions of the substrate 4. The flow cross-section of the second gas stream 3 is generally predetermined by the dimensions of the reactor 10 provided for the CVD process, and can be selected as desired, in principle.

The total gas pressure in the reactor 10 is generally adjusted between 0.1 and 1 bar, preferably between 0.2 and 0.5 bar.

The growth temperatures on the substrate 4 are generally adjusted between 800° C. and 2500° C., and preferably between 1200° C. and 2400° C., to produce monocrystalline SiC.

A particular advantage of the method and the apparatus according to the invention is that SiC crystals with a long length and a large diameter can be grown, since no deposition and/or dissolution phenomena occur, even with graphite walls and graphite parts in the reactor.

What is claimed is:

1. A method for producing silicon carbide, comprising the steps of:
    directing a first gas stream (2) at a substrate (4), the first gas stream (2) containing at least one working gas (SiZ, CY) for providing silicon (Si) and carbon (C) and at least one carrier gas, whereby silicon carbide is deposited on the substrate (4) by chemical vapor deposition (CVD) from the first gas stream (2),
    generating a second gas stream (3) parallel to the direction of flow of and substantially surrounding the first gas stream (2), and
    adjusting a flow velocity of the first gas stream (2) to be between approximately 10 m/min and approximately 300 m/min.

2. The method according to claim 1, wherein the flow velocity of the first gas stream (2) is between approximately 20 m/min and approximately 60 m/min.

3. The method according to claim 1, further comprising: adjusting the flow velocity of the first gas stream (2) to be greater than the flow velocity of the second gas stream (3).

4. The method according to claim 1, wherein a viscosity of the second gas stream (3) is lower than a viscosity of the first gas stream (2).

5. The method according to claim 1, wherein the second gas stream (3) comprises at least one inert gas.

6. The method according to claim 1, further comprising: adjusting a growth temperature on the substrate (4) to be between approximately 800° C. and approximately 2500° C.

7. The method according to claim 1 wherein monocrystalline silicon carbide is produced.

* * * * *